US009804426B2

United States Patent
Li et al.

(10) Patent No.: US 9,804,426 B2
(45) Date of Patent: Oct. 31, 2017

(54) SILICON-GERMANIUM ELECTRO-ABSORPTION MODULATOR

(71) Applicant: Huawei Technologies Co., Ltd., Shenzhen, Guangdong (CN)

(72) Inventors: Yaming Li, Beijing (CN); Buwen Cheng, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/417,822

(22) Filed: Jan. 27, 2017

(65) Prior Publication Data

US 2017/0139239 A1 May 18, 2017

Related U.S. Application Data

(63) Continuation of application No. PCT/CN2014/083472, filed on Jul. 31, 2014.

(51) Int. Cl.
*G02F 1/035* (2006.01)
*G02F 1/025* (2006.01)
(Continued)

(52) U.S. Cl.
CPC .............. *G02F 1/025* (2013.01); *H01L 27/15* (2013.01); *G02F 2001/0157* (2013.01); *G02F 2201/063* (2013.01)

(58) Field of Classification Search
CPC ............ G02F 1/025; G02F 2001/0157; G02F 2201/063
See application file for complete search history.

(56) References Cited

U.S. PATENT DOCUMENTS

| 2007/0116398 A1 | 5/2007 | Pan et al. |
| 2012/0003767 A1 | 1/2012 | Fujikata et al. |

(Continued)

FOREIGN PATENT DOCUMENTS

| CN | 101222121 A | 7/2008 |
| CN | 101939689 A | 1/2011 |

(Continued)

OTHER PUBLICATIONS

Li Ya-Ming, et al., "Design of an evanescent-coupled GeSi electro-absorption modulator based on Franz-Keldysh effect," Acta Phys. Sin., vol. 62, No. 11 (2013), 1Chinese Physical Society, http://wulixb.iphy.ac.cn, 17 pages.

*Primary Examiner* — Sung Pak

(57) ABSTRACT

An electro-absorption modulator, comprising: a substrate layer, including a silicon substrate and an oxide layer disposed on the silicon substrate; top-layer silicon, formed on the oxide layer, where a waveguide layer is formed on the top-layer silicon; a doping layer, including a first doping panel and a second doping panel, where a first-type light doping area is formed on the first doping panel, a second-type light doping area is formed on the second doping panel; and a modulation layer, disposed on the waveguide layer and connected in parallel to the PIN junction. For an incident beam with a specific wavelength, when a modulating electrical signal is reversely applied to the PIN junction, a light absorption coefficient of the modulation layer for the beam changes with the modulating electrical signal, and after the beam passes through a modulation area, optical power of the beam changes.

13 Claims, 3 Drawing Sheets

(51) Int. Cl.
*H01L 27/15* (2006.01)
*G02F 1/015* (2006.01)

(56) References Cited

U.S. PATENT DOCUMENTS

| | | | |
|---|---|---|---|
| 2012/0057815 A1 | 3/2012 | Ezaki et al. | |
| 2012/0177318 A1 | 7/2012 | Zheng et al. | |
| 2015/0316793 A1* | 11/2015 | Ayazi | G02F 1/2257 385/3 |
| 2016/0313577 A1* | 10/2016 | Sun | G02F 1/025 |
| 2017/0168326 A1* | 6/2017 | Ogawa | G02F 1/025 |
| 2017/0184883 A1* | 6/2017 | Sun | G02F 1/025 |

FOREIGN PATENT DOCUMENTS

| | | |
|---|---|---|
| CN | 102067284 A | 5/2011 |
| CN | 103094835 A | 5/2013 |

\* cited by examiner

SILICON-GERMANIUM ELECTRO-ABSORPTION MODULATOR

CROSS-REFERENCE TO RELATED APPLICATIONS

This application is a continuation of International Application No. PCT/CN2014/083472, filed on Jul. 31, 2014, the disclosure of which is hereby incorporated by reference in its entirety.

TECHNICAL FIELD

The present disclosure relates to the field of optical interconnection, and in particular, to a silicon-germanium electro-absorption modulator.

BACKGROUND

As a conventional material in the microelectronics field, a silicon material has absolute advantages for a processing technology and manufacturing costs. However, a conventional interconnection solution based on a metallic wire and a dielectric is limited by a delay, power consumption, bandwidth, and the like, and it is difficult to meet a global requirement of a future many-core system on chip. Compared with electrical interconnection, optical interconnection has advantages such as high bandwidth, low power consumption, and a short delay, and is expected to comprehensively resolve a current problem faced by the electrical interconnection. In recent years, silicon-based optical interconnection has received extensive attention from researchers, and develops rapidly. A silicon-based modulator is one of basic components in a silicon-based optical interconnection technology, and is an important research topic in recent years. Common silicon-based modulators include a modulator based on a free-carrier dispersion effect and a modulator based on electro-absorption.

The modulator based on the free-carrier dispersion effect means that a voltage is applied to a silicon modulation area to cause a distribution change of carriers inside silicon. Due to the free-carrier dispersion effect, a refractive index of light in the silicon also changes, such that an optical signal is modulated. Currently, the modulator based on the free-carrier dispersion effect mainly falls into two types: a silicon Mach-Zehnder interferometer (MZI) modulator, which has advantages such as a higher modulation rate and higher optical bandwidth and disadvantages such as a large size, large power consumption, and a required traveling wave; and a silicon microring modulator, which has advantages such as a small size and a high modulation rate and disadvantages such as extremely sensitivity to temperature, low modulation bandwidth, a small technology tolerance, and poor applicability.

The modulator based on electro-absorption refers to an optical signal modulation component that is manufactured using an electro-optic effect (Franz-Keldysh effect) in a semiconductor, which has advantages such as high modulation bandwidth, low power consumption, practical optical bandwidth, and an acceptable extinction ratio. However, because silicon has a poor electro-optic effect, a second material needs to be introduced and doped into silicon for improvement. A germanium material has a significant electro-optic effect in a C band (1550 nm), and is fully compatible with a conventional complementary metal-oxide-semiconductor (CMOS) technology. Therefore, one promising alternative solution is to use germanium as the second material to manufacture a germanium or silicon-germanium electro-absorption modulator.

The germanium or silicon-germanium modulator has advantages such as a small size, low power consumption, and a high modulation rate. A main topic of this type of modulator is coupling between a germanium or silicon-germanium modulation area and a silicon-based waveguide. Currently, there are mainly two coupling manners. One manner is that the germanium or silicon-germanium modulation area is directly coupled to the silicon-based waveguide by means of alignment. However, because silicon and germanium have different refractive indexes, the manner of direct coupling by means of alignment has end surface reflection, which causes a coupling loss. Further, in a current manufacturing method, a PIN junction is manufactured on the germanium modulation area, which causes light absorption in a doping area, and causes an absorption loss. In addition, the manner of direct coupling by means of alignment has a complex manufacturing technology, and is difficult to implement. The other manner is to perform coupling using an evanescent wave. This type of coupling structure includes a structure of a horizontal PIN junction proposed by the IME in Singapore and a structure of a vertical PIN junction proposed by the Institute of Semiconductors, Chinese Academy of Sciences. For the structure of the horizontal PIN junction proposed by the IME, because a propagation length required for mode field stability is not considered, a propagation loss is large; and because the PIN junction is manufactured on the germanium modulation area, an absorption loss exists. The structure of the vertical PIN junction proposed by the Institute of Semiconductors, Chinese Academy of Sciences has a complex manufacturing technology, and requires technologies such as multiple times of growing, etching, and doping. In addition, to easily manufacture a structure of n++ Si, the silicon-germanium modulation area is wide, and the modulation area has multiple modes, which affects a communication capacity and a transmission distance.

SUMMARY

In view of this, an objective of the present disclosure is to provide a silicon-germanium electro-absorption modulator. A modulation layer is grown by means of selective epitaxy, and a structure design of a parallel connection between the modulation layer and a PIN junction is used, such that a technological process is simplified and manufacturing difficulty is reduced. The electro-absorption modulator has advantages such as a small size, high 3 dB bandwidth, low power consumption, and a small insertion loss.

According to a first aspect, an electro-absorption modulator is provided, including:

a substrate layer, including a silicon substrate and an oxide layer disposed on the silicon substrate;

top-layer silicon, disposed on the oxide layer, where a waveguide layer is formed on the top-layer silicon;

a doping layer, formed on the top-layer silicon, where the doping layer includes a first doping panel and a second doping panel, a first-type light doping area is formed on the first doping panel, a second-type light doping area is formed on the second doping panel, the first-type light doping area and the second-type light doping area are located on two sides of the waveguide layer and closely abut against the waveguide layer, and the first-type light doping area, the waveguide layer, and the second-type light doping area form a PIN junction; and a modulation layer, disposed on the waveguide layer and connected in parallel to the PIN junction, where a beam with a specific wavelength propagates along the waveguide layer, enters a modulation area formed by the modulation layer and the waveguide layer, and then propagates between the modulation layer and the waveguide layer in an oscillation manner; and when a modulating electrical signal is reversely applied to the first-type light doping area and the second-type light doping area, a light absorption coefficient of the modulation layer for the beam changes with the modulating electrical signal, and after the beam passes through the modulation area, optical power of the beam also correspondingly changes, such that electro-optic modulation is implemented for the beam.

In a first possible implementation manner of the first aspect, a silicon dioxide layer is grown and formed on the waveguide layer and the doping layer, a selective epitaxial area is obtained by etching on the silicon dioxide layer, the selective epitaxial area is used to grow the modulation layer, an opening width of the selective epitaxial area in a first direction is selected, and a thickness and a shape of the grown modulation layer is controlled, such that a size of the modulation layer meets a mode matching requirement required when the beam propagates at the waveguide layer and the modulation layer.

With reference to the first possible implementation manner of the first aspect, in a second possible implementation manner, a length of the selective epitaxial area in a second direction is a length of the grown modulation layer; and when the beam propagates in the modulation area, the optical power is oscillated between the modulation layer and the waveguide layer in an oscillation period of $\lambda/(n_1^{\text{eff}}-n_2^{\text{eff}})$, and the length of the modulation layer is an integer multiple of the oscillation period, where $\lambda$ is the wavelength of the beam, $n_1^{\text{eff}}$ is an effective refractive index of the beam at the modulation layer, and $n_2^{\text{eff}}$ is an effective refractive index of the beam at the waveguide layer.

With reference to the second possible implementation manner of the first aspect, in a third possible implementation manner, the first direction is a direction in which the modulating electrical signal is applied, the second direction is a direction in which the beam propagates, and the first direction is perpendicular to the second direction.

In a fourth possible implementation manner of the first aspect, the doping layer further includes:

a first-type heavy doping area, formed on the first doping panel, where the first-type light doping area is located between the first-type heavy doping area and the waveguide layer, and a doping density of the first-type heavy doping area is greater than a doping density of the first-type light doping area; and a second-type heavy doping area, formed on the second doping panel, where the second-type light doping area is located between the second-type heavy doping area and the waveguide layer, and a doping density of the second-type heavy doping area is greater than the doping density of the second-type light doping area.

With reference to the fourth possible implementation manner of the first aspect, in a fifth possible implementation manner, when the first-type is N-type, and the second-type is P-type, that a modulating electrical signal is reversely applied to the first-type light doping area and the second-type light doping area is that a positive electrode of the modulating electrical signal is electrically connected to the first-type light doping area, and a negative electrode of the modulating electrical signal is electrically connected to the second-type light doping area; or when the first-type is P-type, and the second-type is N-type, that a modulating electrical signal is reversely applied to the first-type light doping area and the second-type light doping area is that a negative electrode of the modulating electrical signal is connected to the first-type light doping area, and a positive electrode of the modulating electrical signal is connected to the second-type light doping area.

With reference to the fourth possible implementation manner of the first aspect, in a sixth possible implementation manner, the electro-absorption modulator further includes:

a metal layer, including a first metal electrode layer and a second metal electrode layer, where the first metal electrode layer is formed on the first-type heavy doping area, and the second metal electrode layer is formed on the second-type heavy doping area.

With reference to the sixth possible implementation manner of the first aspect, in a seventh possible implementation manner, the electro-absorption modulator further includes:

a cover layer, formed on the top-layer silicon and covering the top-layer silicon, the doping layer, the waveguide layer, and the modulation layer.

With reference to the seventh possible implementation manner of the first aspect, in an eighth possible implementation manner, a first via and a second via are disposed on the cover layer, the first via is communicated with the first metal electrode layer, and the second via is communicated with the second metal electrode layer, such that the modulating electrical signal is applied to the first metal electrode layer and the second metal electrode layer through the first via and the second via.

In a ninth possible implementation manner of the first aspect, the waveguide layer is a ridge waveguide, and the waveguide layer is made of silicon.

In a tenth possible implementation manner of the first aspect, the modulation layer is made by mixing germanium with silicon according to a pre-determined proportion.

In an eleventh possible implementation manner of the first aspect, the electro-absorption modulator further includes:

a modulation buffer layer, disposed between the waveguide layer and the modulation layer.

In a twelfth possible implementation manner of the first aspect, a built-in electric field caused by the PIN junction exists in the modulation area, and when a modulating electrical signal is reversely applied to the PIN junction, the built-in electric field at the modulation layer changes with the modulating electrical signal, where when the modulating electrical signal is strengthened, the built-in electric field is increased, and the modulation layer absorbs more light of the light wave; or when the modulating electrical signal is weakened, the built-in electric field is decreased, and the modulation layer absorbs less light of the light wave.

According to the electro-absorption modulator provided in the present disclosure, a horizontal PIN junction is formed by design; a selective epitaxial area is obtained by means of etching, to grow a modulation layer; and a length and a thickness of the modulation layer are determined by the selective epitaxial area, such that the length and a width of the modulation layer meet two waveguide modes: a horizontal single mode and a vertical single mode. The modulation layer is connected in parallel to the PIN junction, and when a modulating electrical signal is reversely applied to the PIN junction, a built-in electric field determined by the modulating electrical signal exists at the modulation layer. Due to a Franz-Keldysh effect, a light absorption coefficient of the modulation layer for an incident beam changes with the built-in electric field, such that electro-optic modulation is implemented for the incident beam. The electro-absorption modulator provided in the present disclosure has advantages such as a simple technological process, low manufacturing difficulty, a small size, high 3 dB bandwidth, low power consumption, and a small insertion loss.

BRIEF DESCRIPTION OF THE DRAWINGS

To describe the technical solutions in the present disclosure more clearly, the following briefly introduces the accompanying drawings required for describing the implementation manners. Apparently, the accompanying drawings in the following description show merely some implementation manners of the present disclosure, and a person of ordinary skill in the art may still derive other drawings from these accompanying drawings without creative efforts.

DETAILED DESCRIPTION

The following clearly and describes the technical solutions in the embodiments of the present disclosure with reference to the accompanying drawings in the embodiments of the present disclosure. Apparently, the described embodiments are merely some but not all of the embodiments of the present disclosure. All other embodiments obtained by a person of ordinary skill in the art based on the embodiments of the present disclosure without creative efforts shall fall within the protection scope of the present disclosure.

Figure 1:
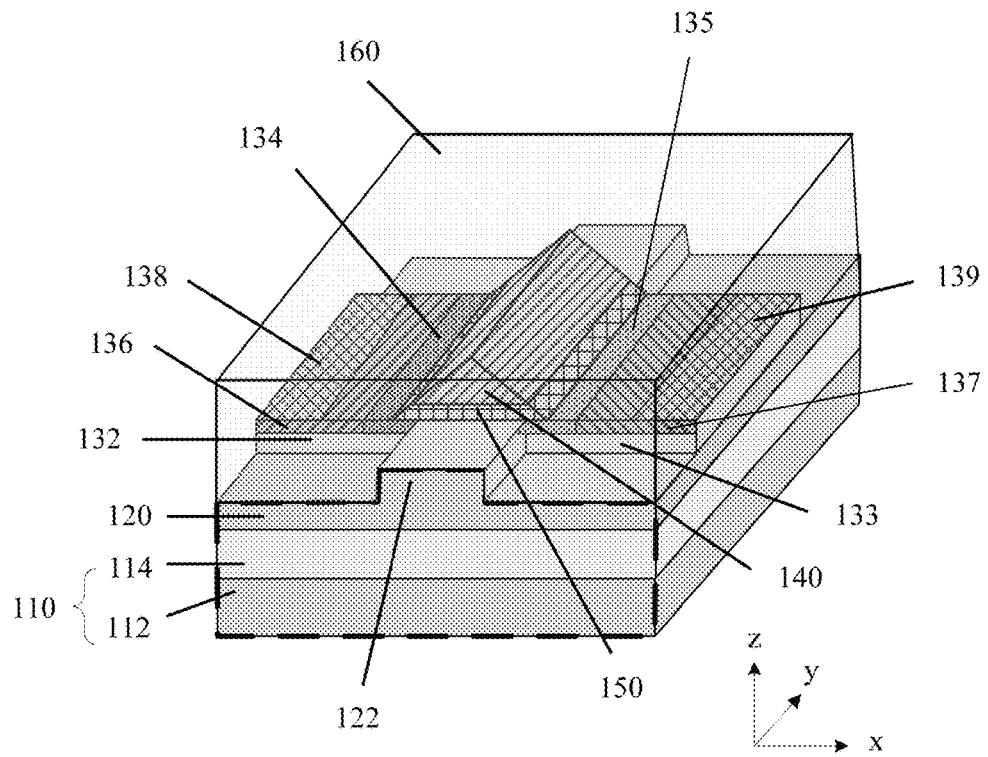
FIG. 1 is a schematic structural diagram of an electro-absorption modulator according to an embodiment of the present disclosure.

Referring to FIG. 1, an embodiment of the present disclosure provides an electro-absorption modulator 100. The electro-absorption modulator 100 includes a substrate layer 110, top-layer silicon 120, a doping layer, and a modulation layer 140. The top-layer silicon 120 is located on the substrate layer 110, and a waveguide layer 122 is formed on the top-layer silicon 120. The doping layer is formed on the top-layer silicon 120, and the doping layer includes a first doping panel 132 and a second doping panel 133. The first doping panel 132 and the second doping panel 133 are respectively located on two sides of the waveguide layer 122, and closely abut against the waveguide layer 122. The modulation layer 140 is formed on the waveguide layer 122, and the modulation layer 140 and the waveguide layer 122 form a modulation area. A beam with a specific wavelength propagates at the waveguide layer 122 in a second direction (that is, a y direction shown in FIG. 1), enters the modulation area, and then propagates between the waveguide layer 122 and the modulation layer 140 in an oscillation manner. When a modulating electrical signal is reversely applied to the first doping panel 132 and the second doping panel 133 in a first direction (that is, an x direction shown in FIG. 1), a light absorption coefficient of the modulation layer 140 for the beam with the specific wavelength changes with strength of the modulating electrical signal, such that light intensity (or optical power) of the beam is modulated.

In this embodiment of the present disclosure, the substrate layer 110 includes a silicon substrate 112 and an oxide layer 114. The oxide layer 114 is formed on the silicon substrate 112, the silicon substrate 112 may be made of silicon, and the oxide layer 114 may be made of silicon dioxide. The top-layer silicon 120 is disposed on the oxide layer 114, such that the silicon substrate 112, the oxide layer 114, and the top-layer silicon 120 form silicon on insulator (SOI).

In this embodiment of the present disclosure, the waveguide layer 122 and the doping layer may be obtained by performing etching and doping on the top-layer silicon 120. The waveguide layer 122 may be a ridge waveguide. Preferably, the waveguide layer 122 meets a single mode condition. The first doping panel 132 and the second doping panel 133 of the doping layer are respectively located on the two sides of the waveguide layer 122, and closely abut against the waveguide layer 122. Preferably, tops of the waveguide layer 122, the first doping panel 132, and the second doping panel 133 maintain parallel and are on a same horizontal plane.

In this embodiment of the present disclosure, a first light ion implantation area may be formed on the first doped panel 132 using a photoetching method, and a second light ion implantation area may be formed on the second doping panel 133 using a photoetching method. The first light ion implantation area and the second light ion implantation area are located on the two sides of the waveguide layer 122, and closely abut against the waveguide layer 122. N-type ions such as a phosphorus ion and an arsenic ion are implanted into the first light ion implantation area, to form a first-type light doping area 134. P-type ions such as a boron ion and a gallium ion are implanted into the second light ion implantation area, to form a second-type light doping area 135. In this case, the first-type is N-type, and the second-type is P-type. An ion implantation concentration may be selected according to an actual requirement, for example, an implantation concentration of $4\times10^{17}/cm^3$ may be selected. The first-type light doping area 134, the waveguide layer 122, and the second-type light doping area 135 form a PIN junction. A first space charge area is formed on an intersection surface of the waveguide layer 122 and the first-type light doping area 134. The first space charge area includes a free electron. A second space charge area is formed on an intersection surface of the waveguide layer 122 and the second-type light doping area 135. The second space charge area includes a free electron hole. A built-in electric field is formed between the first space charge area and the second space charge area. A power line direction of the built-in electric field starts from the second-type light doping area 135, and points to the first-type light doping area 134, and passes through the waveguide layer 122. It can be understood that, in another embodiment of the present disclosure, P-type ions may be implanted into the first light ion implantation area, to form the first-type light doping area 134, and N-type ions may be implanted into the second light ion implantation area, to form the second-type light doping area 135. In this case, the first-type is P-type, and the second-type is N-type. A power line direction of the built-in electric field starts from the first-type light doping area 134, and points to the second-type light doping area 135, and passes through the waveguide layer 122.

In this embodiment of the present disclosure, using a photoetching method at the doping layer, a first heavy ion implantation area may be further formed on the first doping panel 132, and a second heavy ion implantation area may be further formed on the second doping panel 133. Ions (for example, the same N-type ions or the same P-type ions) of a same type as those implanted into the first-type light doping area 134 are implanted into the first heavy ion implantation area, to form a first-type heavy doping area 136. The first-type light doping area 134 is located between the first-type heavy doping area 136 and the waveguide layer 122. Ions (for example, the same P-type ions or the same N-type ions) of a same type as those implanted into the second-type light doping area 135 are implanted into the second heavy ion implantation area, to form a second-type heavy doping area 137. The second-type light doping area 135 is located between the second-type heavy doping area 137 and the waveguide layer 122. Ion implantation concentrations of the first-type heavy doping area 136 and the second-type heavy doping area 137 may be selected according to an actual requirement, for example, may be $1 \times 10^{20}/cm^3$. Due to an ion diffusion effect, the ions in the first-type heavy doping area 136 diffuse to the first-type light doping area 134, and the ions in the second-type heavy doping area 137 diffuse to the second-type light doping area 135. Therefore, two overlapping areas are generated in diffusion areas. An ion concentration of the overlapping area is between $4 \times 10^{17}/cm^3$ and $1 \times 10^{20}/cm^3$, and descends in a direction from the first-type heavy doping area to the first-type light doping area or in a direction from the second-type heavy doping area to the second-type light doping area. The first-type heavy doping area 136 and the second-type heavy doping area 137 are used to apply a modulating electrical signal, such that the modulating electrical signal is applied to the first-type light doping area 134 and the second-type light doping area 135. In addition, because the first-type heavy doping area 136 and the second-type heavy doping area 137 are far from the modulation layer 140, a loss generated when the first-type heavy doping area 136 and the second-type heavy doping area 137 absorb the incident beam may be ignored.

It should be noted that, in this embodiment of the present disclosure, the electro-absorption modulator 100 further includes a metal layer. The metal layer includes a first metal electrode layer 138 and a second metal electrode layer 139. The first metal electrode layer 138 is formed on the first-type heavy doping area 136, and the second metal electrode layer 139 is formed on the second-type heavy doping area 137. A positive electrode and a negative electrode of the modulating electrical signal are electrically connected to the first metal electrode layer 138 and the second metal electrode layer 139, to apply the modulating electrical signal to the first-type heavy doping area 136 and the second-type heavy doping area 137, which reduces contact resistance during applying.

Figure 2A:
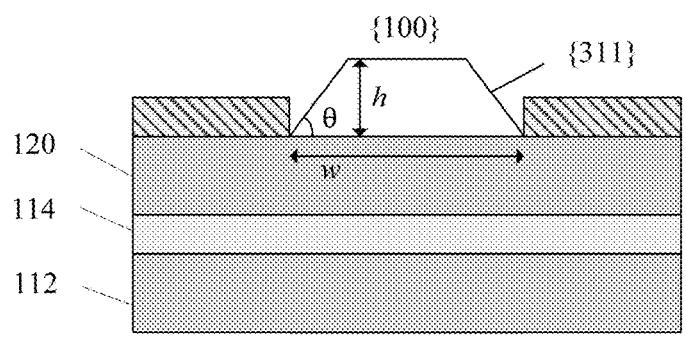
FIG. 2(a) and FIG. 2(b) are schematic diagrams of shapes of a modulation layer with different opening widths.
Figure 2B:
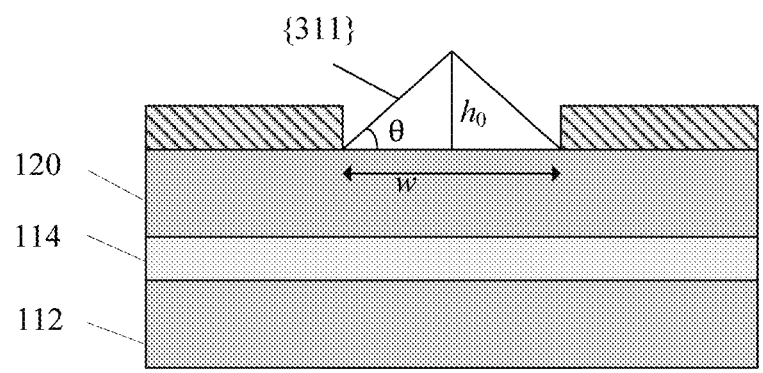

Referring to FIG. 2(*a*) and FIG. 2(*b*) as well, in this embodiment of the present disclosure, the modulation layer 140 may be made by mixing germanium with silicon according to a particular proportion. Steps of growing the modulation layer are specifically as follows: First, select a mixing proportion of germanium and silicon according to an actual requirement, to obtain a required growth material. In a common implementation manner, a working window of the electro-absorption modulator 100 is generally selected to be in a C band, that is, the wavelength of the incident beam is around 1550 nm. Therefore, a band in which an electroluminescent light absorption coefficient of the modulation layer 140 significantly changes (that is, when the wavelength of the incident beam is in the band in which the electroluminescent light absorption coefficient significantly changes, the light absorption coefficient of the modulation layer 140 significantly changes under an action of the modulating electrical signal) needs to be shifted to be around 1550 nm. A band in which an electroluminescent light absorption coefficient of germanium significantly changes is approximately 1620 nm-1640 nm. By doping a particular proportion of silicon into germanium, a band in which an electroluminescent light absorption coefficient of an obtained silicon-germanium mixed material (that is, the modulation layer 140) significantly changes may be shifted to a band of 1540 nm-1560 nm, which ensures highest modulation efficiency of the incident beam. It can be understood that, in another embodiment of the present disclosure, an incident beam with another wavelength may be modulated by changing a mixing proportion of germanium and silicon, and details are not further described herein.

In this embodiment of the present disclosure, a silicon dioxide layer may be grown on the waveguide layer 122 and the doping layer using a plasma enhanced chemical vapor deposition (PECVD) method, and a selective epitaxial area is obtained by etching on the silicon dioxide layer using a photoetching method. Preferably, a length of the selective epitaxial area in the y direction is equal to a length of the doping layer in the y direction. Next, an opening width w of the selective epitaxial area in the x direction is selected. During growth of the modulation layer 140, because a horizontal growth speed and a vertical growth speed are different, a crystal surface {311} is formed on a side surface of the modulation layer 140, and the grown modulation layer 140 is not a cuboid. A shape of the modulation layer 140 is determined by the opening width w. FIG. 2(*a*) and FIG. 2(*b*) show shapes of the grown modulation layer 140 with different opening widths w, where an angle θ is an angle between the crystal surface {311} and a crystal surface {100}. When w>2 h cot θ (h is a growth thickness), a cross section of the modulation layer 140 on an x-z plane is trapezoidal. When w≤2 h cot θ, a cross section of the modulation layer 140 on an x-z plane is triangular, and a thickness of the modulation layer 140 is: $h_0 = w/(2 \cot θ) \le h$. Therefore, a proper opening width w may be selected, the growth thickness of the modulation layer 140 is controlled, and ensure that a length and the thickness of the grown modulation layer 140 meet a predetermined requirement, such that input and output coupling losses are the minimum, modulation efficiency is the highest, and two waveguide modes are met: a horizontal single mode and a vertical single mode.

It should be noted that, the electro-absorption modulator 140 further includes a modulation buffer layer 150. In a growth process of the modulation layer 140, during transition from silicon to silicon-germanium, a silicon-germanium concentration needs to be gradually increased, to prevent dislocation due to different material crystal lattice constants. The modulation buffer layer 150 is grown when the material concentration is gradually increased. The modulation buffer layer 150 may be used to reduce dislocation of the subsequently grown modulation layer 140.

It should be noted that, in this embodiment of the present disclosure, the electro-absorption modulator 100 further includes a cover layer 160. The cover layer 160 may be silicon dioxide, and covers the top-layer silicon 120, the doping layer, the waveguide layer 122, and the modulation layer 140 using a deposition method, to protect the electro-absorption modulator 100 from pollution of an external object, damage of an external force, or the like. A first via and a second via are further disposed on the cover layer 160, the first via is communicated with the first metal electrode layer 138, and the second via is communicated with the second metal electrode layer 139, such that the modulating electrical signal is applied to the first metal electrode layer 138 and the second metal electrode layer 139 through the first via and the second via. It should be noted that, because light intensity in areas on two sides of the modulation layer 140 is weak, in a preferred solution, the first via and the second via should be disposed in the areas on the two sides of the modulation layer 140, to ensure small metal-induced light absorption.

The following describes a modulation principle and a modulation process of the electro-absorption modulator 100 provided in this embodiment of the present disclosure.

Figure 3:
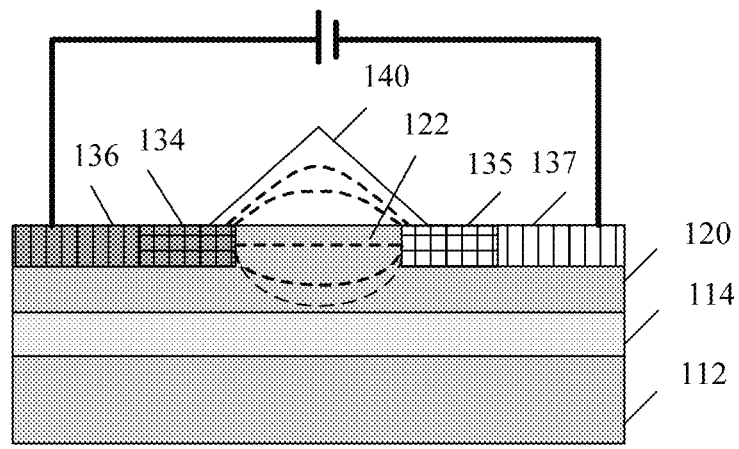
FIG. 3 is a distribution diagram of a built-in electric field after a modulating electrical signal is applied to the electro-absorption modulator shown in FIG. 1.

Referring to FIG. 3 as well, in this embodiment of the present disclosure, when the first-type is N-type, and the second-type is P-type, the positive electrode of the modulating electrical signal is electrically connected to the first-type heavy doping area 136 through the first via and the first metal electrode layer 138, and the negative electrode of the modulating electrical signal is electrically connected to the second-type heavy doping area 137 using the second via and the second metal electrode layer 139, such that the modulating electrical signal is reversely applied to the electro-absorption modulator 100. In this case, because reverse bias is applied, most carriers (that is, free electrons) in the first-type light doping area 134 move towards the positive electrode, and most carriers (that is, free electron holes) in the second-type light doping area 135 move towards the negative electrode. Therefore, widths of the first space charge area and the second space charge area are increased, and the built-in electric field formed between the first space charge area and the second space charge area is also correspondingly increased. The direction of the built-in electric field starts from the first-type light doping area 134, and points to the second-type light doping area 135, and passes through the waveguide layer 122. Because the modulation layer 140 and the PIN junction are connected in parallel, the built-in electric field also exists at the modulation layer 140. In this case, a Franz-Keldysh effect occurs at the modulation layer 140 under an action of the built-in electric field. The Franz-Keldysh effect is mainly as follows: (1) For an incident beam lower than a material band gap of the modulation layer 140, a light absorption coefficient of the modulation layer 140 for the incident beam is increased. (2) For incident light higher than a material band gap of the modulation layer 140, a light absorption coefficient of the modulation layer 140 for the incident beam is oscillated. Because the band in which the electroluminescent light absorption coefficient of the modulation layer 140 significantly changes has already been shifted to be around 1550 nm (that is, the band gap of the modulation layer 140 is close to photon energy of the incident beam), when the modulating electrical signal is additionally applied, modulation efficiency of the incident beam is high at the modulation layer 140.

In this embodiment of the present disclosure, when incident light with a specific wavelength (for example, around a wavelength of 1550 nm) is incident into the waveguide layer 122 in they direction, and enters the modulation area formed by the waveguide layer 122 and the modulation layer 140, the incident beam propagates between the waveguide layer 122 and the modulation layer 140 in the oscillation manner. After a modulating electrical signal is reversely applied to the first metal electrode layer 138 and the second metal electrode layer 139, due to the Franz-Keldysh effect, a light absorption coefficient of the modulation layer 140 for the beam propagating at the modulation layer 140 is increased. The incident beam is absorbed each time the incident beam enters the modulation layer 140, such that optical power is decreased. A degree to which the optical power of the incident light is decreased is related to field strength of the modulating electrical signal. When the modulating electrical signal is at a low level $V_1$, the light absorption coefficient of the modulation layer 140 for the incident light is small, and most of the incident light is not absorbed, and continues to propagate at the waveguide layer 122 in the y direction after passing through the modulation area. In this case, the electro-absorption modulator 100 is in an "on" state. When the modulating electrical signal is at a high level $V_2$, the light absorption coefficient of the modulation layer 140 for the incident light is large, and most of the incident beam is absorbed by the modulation layer 140. In this case, the electro-absorption modulator 100 is in an "off" state. According to a level change of the input modulating electrical signal, the light absorption coefficient of the modulation layer 140 correspondingly changes, and output optical power correspondingly changes, such that electro-optic modulation is implemented.

It should be noted that, in this embodiment of the present disclosure, when the incident beam propagates in the modulation area in which the modulation layer 140 and the waveguide layer 122 are located, there are two conduction modes (that is, a conduction mode at the modulation layer 140 and a conduction mode at the waveguide layer 122). Due to interference between the two conduction modes, the optical power of the incident beam is oscillated between the modulation layer 140 and the waveguide layer 122 under the modulation layer 140. An oscillation period T is equal to $\lambda/(n_1^{eff}-n_2^{eff})$, where $\lambda$ is the wavelength of the beam, $n_1^{eff}$ is an effective refractive index of the beam at the modulation layer 140, and $n_2^{eff}$ is an effective refractive index of the beam at the waveguide layer 122. To ensure a small insertion loss in an "on" state, the length of the modulation layer 140 in the y direction should be an integer multiple of the oscillation period T, such that the incident beam is right routed to the waveguide layer 122 after leaving the modulation area. When the length of the modulation layer 140 in the y direction is not an integer multiple of the oscillation period T, if the incident beam is coupled to the modulation layer 140 in the oscillation manner after leaving the modulation area, the beam is scattered regardless of an "on" state or an "off" state. Consequently, there is an extremely large insertion loss, an extinction ratio is even close to zero, and electro-optic modulation cannot be implemented.

Figure 4A:
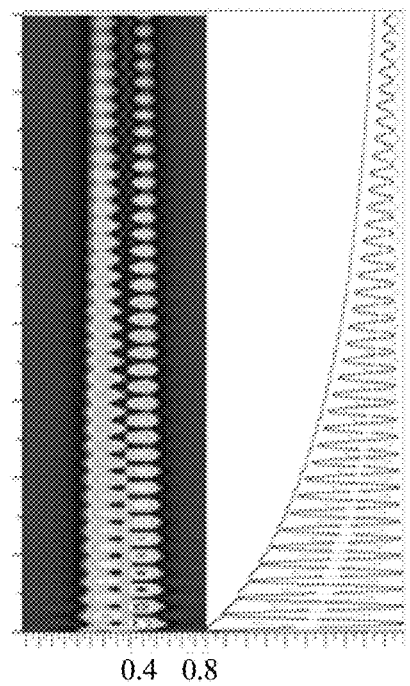
FIG. 4(a) is a light intensity change diagram of an electro-absorption modulator in an "off" state.
Figure 4B:
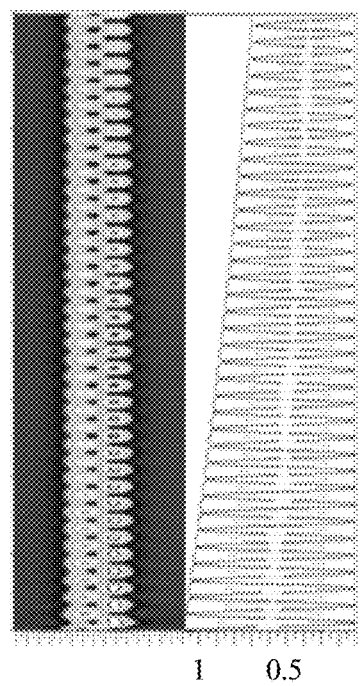
FIG. 4(b) is a light intensity change diagram of an electro-absorption modulator in an "on" state.

Referring to FIG. 4(a) and FIG. 4(b) as well, FIG. 4(a) is a light intensity change diagram of the electro-absorption modulator 100 in an off state according to an embodiment of the present disclosure, and FIG. 4(b) is a light intensity change diagram of the electro-absorption modulator 100 in an on state according to an embodiment of the present disclosure. As shown in FIG. 4(a), when the beam passes through the modulation area, due to the interference between the two conduction modes, the beam is oscillated between the modulation layer 140 and the waveguide layer 122 under the modulation layer 140. When the applied modulating electrical signal is strong or at a high level of the modulating electrical signal, the light absorption coefficient of the modulation layer 140 is increased. The beam is partially absorbed each time the beam passes through the modulation layer 140 in the oscillation manner, and the incident beam is basically fully absorbed until the incident beam passes through the modulation area. In this case, the electro-absorption modulator 100 is in an "off" state. As shown in FIG. 4(b), when no modulating electrical signal is applied to the electro-absorption modulator 100, or the applied modulating electrical signal is weak or at a low level of the modulating electrical signal, the incident beam is oscillated up and down in the modulation area, but the modulation layer 140 absorbs less of the incident light. After the beam passes through the modulation area, because the length of the modulation layer 140 in the y direction is right the integer multiple of the oscillation period T by design, the incident light is fully coupled to the waveguide layer 122. Because most of the beam can still pass through the modulation area, the electro-absorption modulator 100 is in an "on" state. Simulation and calculation results show that an extinction ratio ER of the electro-absorption modulator 100 provided in this embodiment of the present disclosure is approximately 8 dB, 3 dB bandwidth is greater than 50 GHz, and an insertion loss IL is approximately 3.2 dB, which achieves a good effect.

In conclusion, according to the electro-absorption modulator provided in this embodiment of the present disclosure, a horizontal PIN junction is formed by design; the selective epitaxial area is obtained by means of etching, to grow a modulation layer 140; and a length and a thickness of the modulation layer 140 are determined by the selective epitaxial area, such that the length and a width of the modulation layer 140 meet two waveguide modes: a horizontal single mode and a vertical single mode. The modulation layer 140 is connected in parallel to the PIN junction, and when a modulating electrical signal is reversely applied to the PIN junction, a built-in electric field determined by the modulating electrical signal exists at the modulation layer 140. Due to a Franz-Keldysh effect, a light absorption coefficient of the modulation layer 140 for an incident beam changes with the built-in electric field, such that electro-optic modulation is implemented for the incident beam. The electro-absorption modulator 100 provided in the present disclosure has advantages such as a simple technological process, low manufacturing difficulty, a small size, high 3 dB bandwidth, low power consumption, and a small insertion loss.

The foregoing descriptions are exemplary implementation manners of the present disclosure. It should be noted that a person of ordinary skill in the art may make certain improvements and polishing without departing from the principle of the present disclosure and the improvements and polishing shall fall within the protection scope of the present disclosure.

What is claimed is:

1. An electro-absorption modulator, comprising:
    a substrate layer, comprising a silicon substrate and an oxide layer disposed on the silicon substrate;
    a top-layer silicon, wherein a waveguide layer is formed on the top-layer silicon;
    a doping layer, formed on the top-layer silicon, wherein the doping layer comprises a first doping panel and a second doping panel, a first-type light doping area is formed on the first doping panel, a second-type light doping area is formed on the second doping panel, the first-type light doping area and the second-type light doping area are located on two sides of the waveguide layer and abut against the waveguide layer, and the first-type light doping area, the waveguide layer, and the second-type light doping area form a PIN junction; and
    a modulation layer, disposed on the waveguide layer and connected in parallel to the PIN junction, wherein when a beam with a specific wavelength enters a modulation area formed by the modulation layer and the waveguide layer, a modulating electrical signal is reversely applied to the first-type light doping area and the second-type light doping area, optical power of the beam changes after the beam passes through the modulation area, such that electro-optic modulation is implemented for the beam, wherein a light absorption coefficient of the modulation layer for the beam changes with the modulating electrical signal.

2. The electro-absorption modulator according to claim 1, wherein:
    a silicon dioxide layer is formed on the waveguide layer and the doping layer; and
    a selective epitaxial area is obtained by etching on the silicon dioxide layer, the selective epitaxial area is used to grow the modulation layer, an opening width of the selective epitaxial area in a first direction is selected, and a thickness and a shape of the grown modulation layer is controlled, such that a size of the modulation layer meets a mode matching requirement when the beam propagates at the waveguide layer and the modulation layer.

3. The electro-absorption modulator according to claim 2, wherein a length of the selective epitaxial area in a second direction is a length of the grown modulation layer; and when the beam propagates in the modulation area, the optical power is oscillated between the modulation layer and the waveguide layer in an oscillation period of $\lambda/(n_1^{\mathit{eff}}-n_2^{\mathit{eff}})$, and the length of the modulation layer is an integer multiple of the oscillation period, wherein $\lambda$ is the wavelength of the beam, $n_1^{\mathit{eff}}$ is an effective refractive index of the beam at the modulation layer, and $n_2^{\mathit{eff}}$ is an effective refractive index of the beam at the waveguide layer.

4. The electro-absorption modulator according to claim 3, wherein the first direction is a direction in which the modulating electrical signal is applied, the second direction is a direction in which the beam propagates, and the first direction is perpendicular to the second direction.

5. The electro-absorption modulator according to claim 1, wherein the doping layer further comprises:
    a first-type heavy doping area, formed on the first doping panel, wherein the first-type light doping area is located between the first-type heavy doping area and the waveguide layer, and a doping density of the first-type heavy doping area is greater than a doping density of the first-type light doping area; and
    a second-type heavy doping area, faulted on the second doping panel, wherein the second-type light doping area is located between the second-type heavy doping area and the waveguide layer, and a doping density of the second-type heavy doping area is greater than the doping density of the second-type light doping area.

6. The electro-absorption modulator according to claim 5, wherein:
    the first-type is N-type, and the second-type is P-type; and
    a modulating electrical signal is reversely applied to the first-type light doping area and the second-type light doping area comprises a positive electrode of the modulating electrical signal is electrically connected to the first-type light doping area, and a negative electrode of the modulating electrical signal is electrically connected to the second-type light doping area.

7. The electro-absorption modulator according to claim 5, wherein the electro-absorption modulator further comprises:
    a metal layer, comprising a first metal electrode layer and a second metal electrode layer, wherein the first metal electrode layer is formed on the first-type heavy doping area, and the second metal electrode layer is formed on the second-type heavy doping area.

8. The electro-absorption modulator according to claim 7, further comprising:

a cover layer, formed on the top-layer silicon and covering the top-layer silicon, the doping layer, the waveguide layer, and the modulation layer.

9. The electro-absorption modulator according to claim 8, wherein a first via and a second via are disposed on the cover layer, the first via is communicated with the first metal electrode layer, and the second via is communicated with the second metal electrode layer, such that the modulating electrical signal is applied to the first metal electrode layer and the second metal electrode layer through the first via and the second via.

10. The electro-absorption modulator according to claim 1, wherein the waveguide layer is a ridge waveguide, and the waveguide layer is made of silicon.

11. The electro-absorption modulator according to claim 1, wherein the modulation layer is made by mixing germanium with silicon according to a pre-determined proportion.

12. The electro-absorption modulator according to claim 1, wherein the electro-absorption modulator further comprises:
a modulation buffer layer, disposed between the waveguide layer and the modulation layer.

13. The electro-absorption modulator according to claim 1, wherein a built-in electric field caused by the PIN junction exists in the modulation area, and when a modulating electrical signal is reversely applied to the PIN junction, the built-in electric field at the modulation layer changes with the modulating electrical signal, wherein when the modulating electrical signal is strengthened, the built-in electric field is increased, and the modulation layer absorbs more of the beam; or when the modulating electrical signal is weakened, the built-in electric field is decreased, and the modulation layer absorbs less of the beam.

* * * * *